(12) United States Patent
McDonald et al.

(10) Patent No.: US 12,249,525 B1
(45) Date of Patent: Mar. 11, 2025

(54) USING SPECTROSCOPIC MEASUREMENTS FOR SUBSTRATE TEMPERATURE MONITORING

(71) Applicant: Applied Materials, Inc., Santa Clara, CA (US)

(72) Inventors: Ian McDonald, Santa Clara, CA (US); Prashant Aji, San Jose, CA (US); Chengqing Wang, Milpitas, CA (US); Shifang Li, Pleasanton, CA (US); Xinyuan Chong, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/680,896

(22) Filed: May 31, 2024

(51) Int. Cl.
*H01L 21/67* (2006.01)
*H01L 21/66* (2006.01)

(52) U.S. Cl.
CPC .. *H01L 21/67248* (2013.01); *H01L 21/67184* (2013.01); *H01L 21/67253* (2013.01); *H01L 22/12* (2013.01)

(58) Field of Classification Search
CPC ................................ H01L 21/66; H01L 21/67
See application file for complete search history.

(56) References Cited

U.S. PATENT DOCUMENTS

| | | | |
|---|---|---|---|
| 7,585,686 | B2 | 9/2009 | Verhaverbeke et al. |
| 9,478,421 | B2 | 10/2016 | Bencher et al. |
| 10,109,481 | B2 | 10/2018 | Zhu et al. |
| 10,816,464 | B2 | 10/2020 | Zhao et al. |
| 11,112,231 | B2 | 9/2021 | Zhao |
| 11,150,078 | B1 | 10/2021 | Zhao et al. |

*Primary Examiner* — Marvin Payen
(74) *Attorney, Agent, or Firm* — Kilpatrick Townsend & Stockton LLP (57) ABSTRACT

Systems, methods, and computer-readable mediums for monitoring temperature of a substrate are described. Spectroscopic measurements are performed on a surface of the substrate using a metrology tool integrated with a processing tool. The measurements may be used to determine that the substrate has cooled below a threshold temperature using the spectroscopic measurements.

15 Claims, 5 Drawing Sheets

┌─────────────────────────────────────────────────────────────────────┐
│  Arranging a semiconductor substrate within a first processing      │
│  chamber of a semiconductor processing tool            505          │
└─────────────────────────────────────────────────────────────────────┘
                              ↓
┌─────────────────────────────────────────────────────────────────────┐
│  Performing a first fabrication process on the semiconductor        │
│  substrate in the first processing chamber             510          │
└─────────────────────────────────────────────────────────────────────┘
                              ↓
┌─────────────────────────────────────────────────────────────────────┐
│  Moving the semiconductor substrate from the first processing       │
│  chamber to a cool down chamber                        515          │
└─────────────────────────────────────────────────────────────────────┘
                              ↓
┌─────────────────────────────────────────────────────────────────────┐
│  Performing spectroscopic measurements on a surface of the          │
│  semiconductor substrate in the cool down chamber using a metrology │
│  tool integrated with the semiconductor processing tool    520      │
└─────────────────────────────────────────────────────────────────────┘
                              ↓
┌─────────────────────────────────────────────────────────────────────┐
│  Determining that the semiconductor substrate has cooled below a    │
│  threshold temperature using the spectroscopic                      │
│  measurements                                          525          │
└─────────────────────────────────────────────────────────────────────┘
                              ↓
┌─────────────────────────────────────────────────────────────────────┐
│  Moving the semiconductor substrate from the cool down chamber to a │
│  second processing chamber                             530          │
└─────────────────────────────────────────────────────────────────────┘
                              ↓
┌─────────────────────────────────────────────────────────────────────┐
│  Performing a second fabrication process on the semiconductor       │
│  substrate in the second processing chamber            535          │
└─────────────────────────────────────────────────────────────────────┘
```

USING SPECTROSCOPIC MEASUREMENTS FOR SUBSTRATE TEMPERATURE MONITORING

TECHNICAL FIELD

The present disclosure relates generally to semiconductor fabrication, and more particularly (although not necessarily exclusively), to using spectroscopic measurements for substrate temperature monitoring.

BACKGROUND

Recent advances in optimization of semiconductor devices have driven the need to combine multiple process steps (e.g. deposition, etch, implant, anneal) into a single vacuum mainframe or into a single chamber. This in-vacuum or in-chamber integration of different process steps avoids deleterious effects of atmospheric contamination on very thin and often chemically active films and interfaces.

Emerging deployment of in-vacuum and in-chamber process integration also creates new challenges for semiconductor device metrology. Measurements which are typically performed at atmosphere in standalone metrology tools must now be performed in situ or in the vacuum mainframe of a process tool where engineering and space constraints limit options to enhance measurement sensitivity through movement of the metrology optics or the device under test.

SUMMARY

Some embodiments propose improved methods and systems for monitoring substrate temperature. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method for monitoring temperature of a semiconductor substrate during a cool down step of a multi-step fabrication process. The method also includes arranging the semiconductor substrate within a first processing chamber of a semiconductor processing tool and performing a first fabrication process on the semiconductor substrate in the first processing chamber. The semiconductor substrate is moved from the first processing chamber to a cool down chamber. Spectroscopic measurements are performed on a surface of the semiconductor substrate in the cool down chamber using a metrology tool integrated with the semiconductor processing tool. The method also includes determining that the semiconductor substrate has cooled below a threshold temperature using the spectroscopic measurements. Some embodiments also include moving the semiconductor substrate from the cool down chamber to a second processing chamber and performing a second fabrication process on the semiconductor substrate in the second processing chamber. Other embodiments of this aspect include corresponding computer systems, apparatus, and computer programs recorded on one or more computer storage devices, each configured to perform the actions of the methods.

Implementations may include one or more of the following features. The method where all the steps are performed under continuous vacuum. Performing the spectroscopic measurements may include obtaining reflectance measurements at multiple different areas on the surface of the semiconductor substrate simultaneously, where the multiple different areas have a same film stack and/or similar surface features. The second fabrication process may be performed at a lower temperature than the first fabrication process. The first fabrication process may be a film deposition process or an anneal process. The method may also include modeling a relationship between one or more optical constants of film stacks or the semiconductor substrate and temperature of the film stacks or the semiconductor substrate. Implementations of the described techniques may include hardware, a method or process, or computer software on a computer-accessible medium.

Another general aspect includes a method for processing a semiconductor substrate in a semiconductor processing tool. The method also includes, while the semiconductor substrate is in a cool down chamber of the semiconductor processing tool, performing spectroscopic measurements on a surface of the semiconductor substrate using a metrology tool integrated with the semiconductor processing tool, where the spectroscopic measurements are performed on multiple different areas on the surface of the semiconductor substrate. The method also includes determining that the semiconductor substrate has cooled below a threshold temperature using the spectroscopic measurements, and upon determining that the semiconductor substrate has cooled below the threshold temperature, moving the semiconductor substrate to a processing chamber of the semiconductor processing tool. Other embodiments of this aspect include corresponding computer systems, apparatus, and computer programs recorded on one or more computer storage devices, each configured to perform the actions of the methods.

Yet another general aspect includes a system for processing a semiconductor substrate. The system includes a semiconductor processing tool and a metrology tool integrated with the semiconductor processing tool, where the metrology tool is configured to monitor temperature of semiconductor substrates in a cool down chamber of the semiconductor processing tool by performing steps including: performing spectroscopic measurements on a surface of the semiconductor substrates in the cool down chamber of the semiconductor processing tool, and determining that the semiconductor substrate in the cool down chamber has cooled below a threshold temperature using the spectroscopic measurements. Other embodiments of this aspect include corresponding computer systems, apparatus, and computer programs recorded on one or more computer storage devices, each configured to perform the actions of the methods.

Yet another general aspect includes a computer-readable medium storing instructions that, when executed by a computer, cause the computer to perform steps comprising: performing spectroscopic measurements on a surface of a semiconductor substrate in a cool down chamber of a semiconductor processing tool, wherein the spectroscopic measurements are performed using a metrology tool integrated with the semiconductor processing tool; and determining that the semiconductor substrate in the cool down chamber has cooled below a threshold temperature using the spectroscopic measurements.

Implementations may include one or more of the following features. The semiconductor processing tool may include one or more additional chambers configured to perform fabrication processes on the semiconductor substrates. The semiconductor processing tool may include two or more additional chambers configured to perform fabrication processes on the semiconductor substrates, where at least one of the fabrication processes is a film deposition process. The processing tool may be configured to maintain the cool down chamber under continuous vacuum during the spectroscopic measurements and while moving the semiconductor substrates between the cool down chamber and the other chambers. Implementations of the described techniques may include hardware, a method or process, or computer software on a computer-accessible medium.

A further understanding of the nature and advantages of the present invention may be realized by reference to the following portions of the specification and attached drawings.

DETAILED DESCRIPTION

In the following detailed description, numerous specific details are set forth in order to provide a thorough understanding of the embodiments described herein. However, it should be understood that the various embodiments can be practiced without these specific details. In other instances, well-known methods, procedures, and components have not been described in detail so as not to obscure the described features.

Reference will be made in detail to the various embodiments, one or more examples of which are illustrated in the figures. Each example is provided by way of explanation and is not meant as a limitation. Further, features illustrated or described as part of one embodiment can be used on or in conjunction with other embodiments to yield yet further embodiments. The description is intended to include these modifications and variations.

A "substrate" or "sample" as referred to herein includes, but is not limited to, a semiconductor wafer, a semiconductor work piece, a photolithography mask, and other work pieces such as photovoltaic cells and the like.

According to some embodiments, which can be combined with other embodiments described herein, the systems and methods may be configured for or applied to semiconductor processing applications that include integrated processing and metrology systems. The processing systems may form or modify layers in the process of creating integrated circuits. The metrology systems may provide analysis of the layers or structures that are formed. As an example, a reflectometer may be used to provide spectroscopic analysis to determine, for example, layer thickness or composition. The analysis may be used for process monitoring and/or control.

Some embodiments described herein provide improved methods and systems for monitoring substrate temperature in integrated processing and metrology systems. As explained above, metrology systems may use spectroscopic analysis to determine substrate characteristics such as layer thickness or composition. These metrology systems may also use spectroscopic analysis along with a proper model to monitor substrate temperature as described more fully below.

Figure 1:
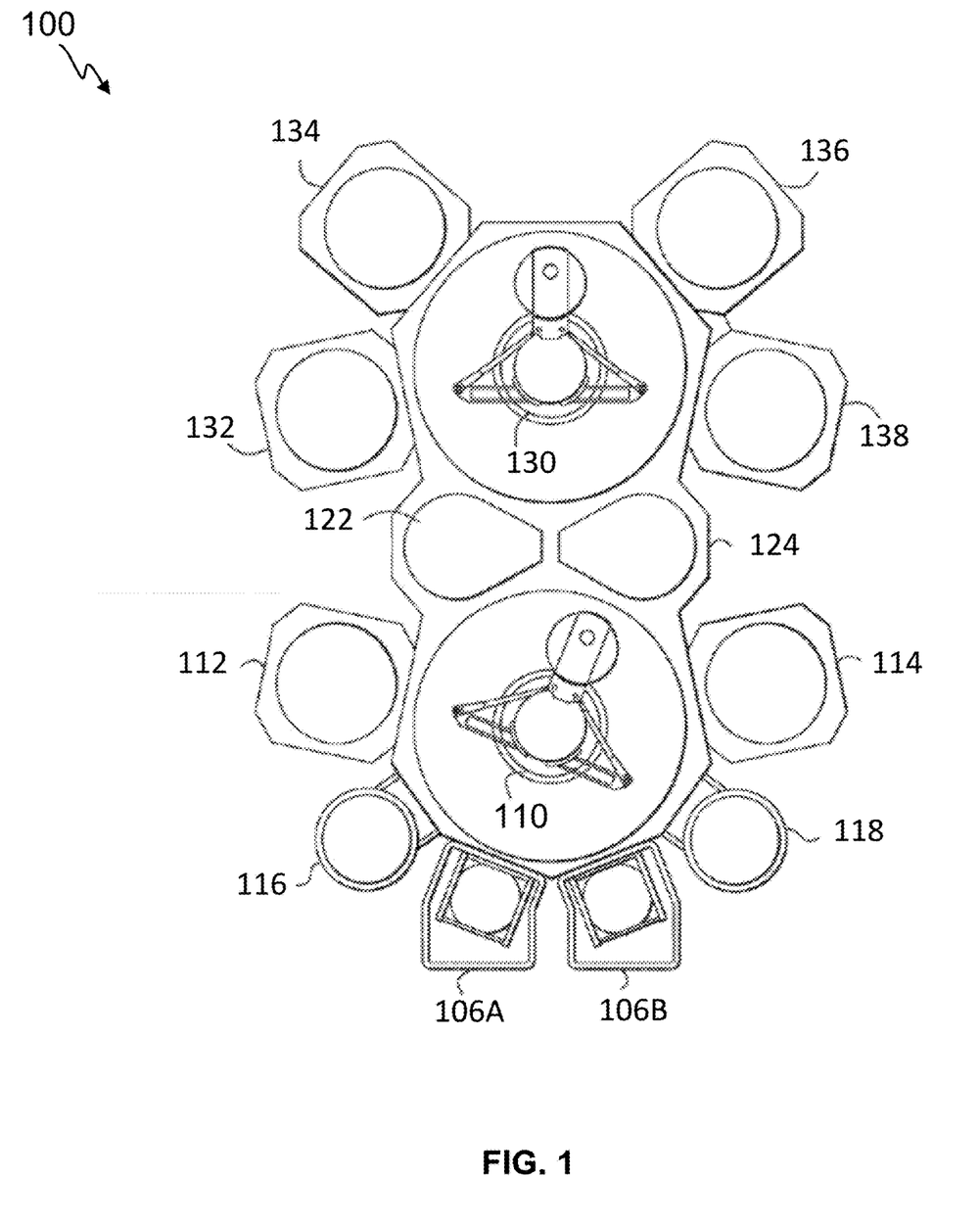
FIG. 1 is a simplified top plan view of an exemplary processing system according to some embodiments of the present technology.

FIG. 1 shows a top plan view of an exemplary processing system 100 according to some embodiments of the present technology. The processing system 100 may include, for example, chambers for deposition, etching, baking, curing, and the like according to some embodiments. The processing system 100 may also include one or more load lock chambers 106A, 106B for transferring substrates into and out of the processing system 100. In some configurations, the processing system 100 may be under vacuum, and the load lock chambers 106A, 106B may be "pumped down" after substrates are introduced into the load lock chambers 106A, 106B. A first robot 110 may transfer the substrates between the load lock chambers 106A, 106B and a first set of one or more substrate processing chambers 112, 114, 116, 118 (four are shown in this example). Each substrate processing chamber 112, 114, 116, 118 can be configured to perform one or more substrate processing operations, such as cyclical layer deposition (CLD), atomic layer deposition (ALD), chemical vapor deposition (CVD), physical vapor deposition (PVD), plasma-enhanced chemical vapor deposition (PECVD), etch, pre-clean, degas, implant, anneal, substrate orientation, and/or other processing steps. The substrate processing chambers may include one or more system components for depositing, annealing, curing, etching, or performing other processes.

The first robot 110 can also transfer substrates to/from one or more intermediate transfer chambers 122, 124. The intermediate transfer chambers 122, 124 can be used to maintain vacuum conditions while allowing substrates to be transferred within the processing system 100. A second robot 130 can transfer the substrates between the intermediate transfer chambers 122, 124 and a second set of one or more processing chambers 132, 134, 136, 138. Similar to processing chambers 112, 114, 116, 118, each of the processing chambers 132, 134, 136, 138 can be configured to perform a variety of substrate processing operations.

It should be appreciated that the processing system 100 is used merely an example, and other configurations and different processing chambers may be used with the embodiments described herein.

In some embodiments, a metrology tool, such as a metrology tool configured to perform spectroscopic measurements, may be integrated with the processing system 100. An example of such a metrology tool is a reflectometer. Although not shown in FIG. 1, the metrology tool may be arranged to provide analysis of the substrates after the substrates are processed in the processing chambers (or between processes). Results of the analysis may be used for process monitoring and control. As an example, a reflectometer may be arranged to determine layer thickness or composition when the substrates are transferred from one of the processing chambers into one or the intermediate transfer chambers 122, 124.

The reflectometer may also be used along with an appropriate model to monitor temperature of the substrates in the intermediate transfer chambers 122, 124. In some scenarios, a substrate may be transferred into one of the intermediate transfer chambers 122, 124 from a high temperature process. The metrology tool may determine a characteristic of a layer on the substrate (e.g., film thickness), and the substrate may require cooling before transfer to another processing chamber or to one of the load lock chambers 106A, 106B. In some embodiments, the same metrology tool used to determine the characteristic of the layer on the substrate may be used to monitor temperature of the substrate. The substrate can be transferred to the next processing or load lock chamber once it has cooled to the appropriate temperature.

Figure 2:
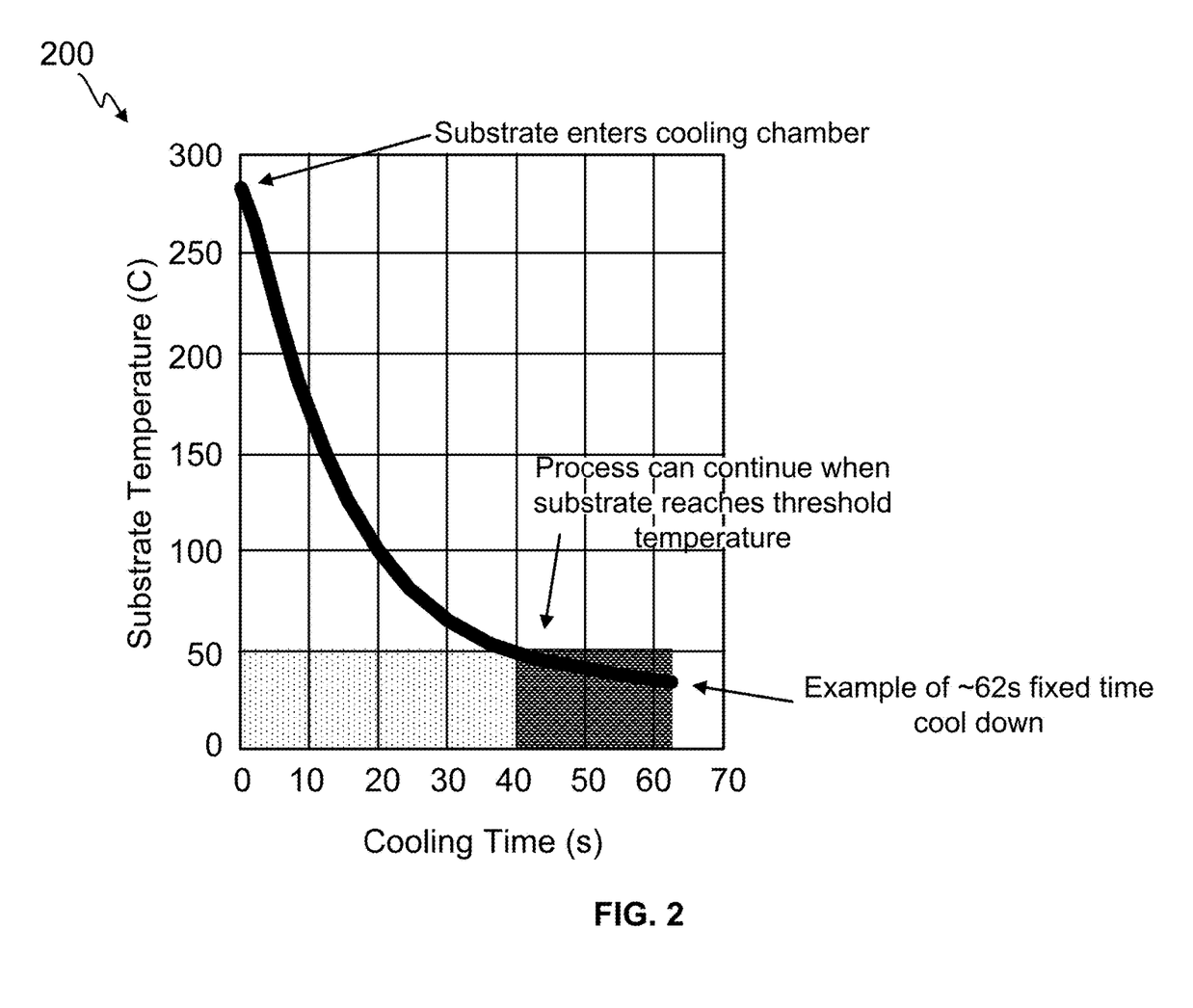
FIG. 2 is simplified plot showing an exemplary cool down time of a substrate in a cooling chamber according to some embodiments of the present technology.

FIG. 2 is simplified plot 200 showing an exemplary cool down time of a substrate in a cooling chamber according to some embodiments of the present technology. In this example, the substrate enters, for example, one of the transfer chambers 122, 124, and the temperature is about 275° C. when first measured at time 0 seconds. The initial temperature may be determined as soon as the substrate is transferred into the chamber, or it may be determined after other analyses are complete (e.g., after film thickness and/or composition measurements). The shaded portion of the plot 200 below 50° C. is intended to illustrate a threshold temperature that the substrate must reach before being transferred to another chamber.

In some embodiments, a fixed cool down time, such as the 62 seconds in this example, may be used before transferring the substrate out of the transfer chamber. The fixed time is typically determined by taking into account expected variables and generally includes some buffer to ensure the substrate is below the threshold temperature before being transferred to another chamber.

In other embodiments, the same metrology tool that is used for other analyses may be used to monitor the temperature of the substrate. This allows the substrate to be transferred to the next processing chamber or load lock chamber once it has reached the threshold temperature. In the plot 200 shown in FIG. 2, the substrate reaches the threshold temperature of 50° C. after 40 seconds, thus saving 22 seconds compared to the 62 second fixed cool down time. The total processing time is reduced without additional cost by utilizing the same metrology tool to monitor temperature that is already used for other metrology measurements.

Figure 3:
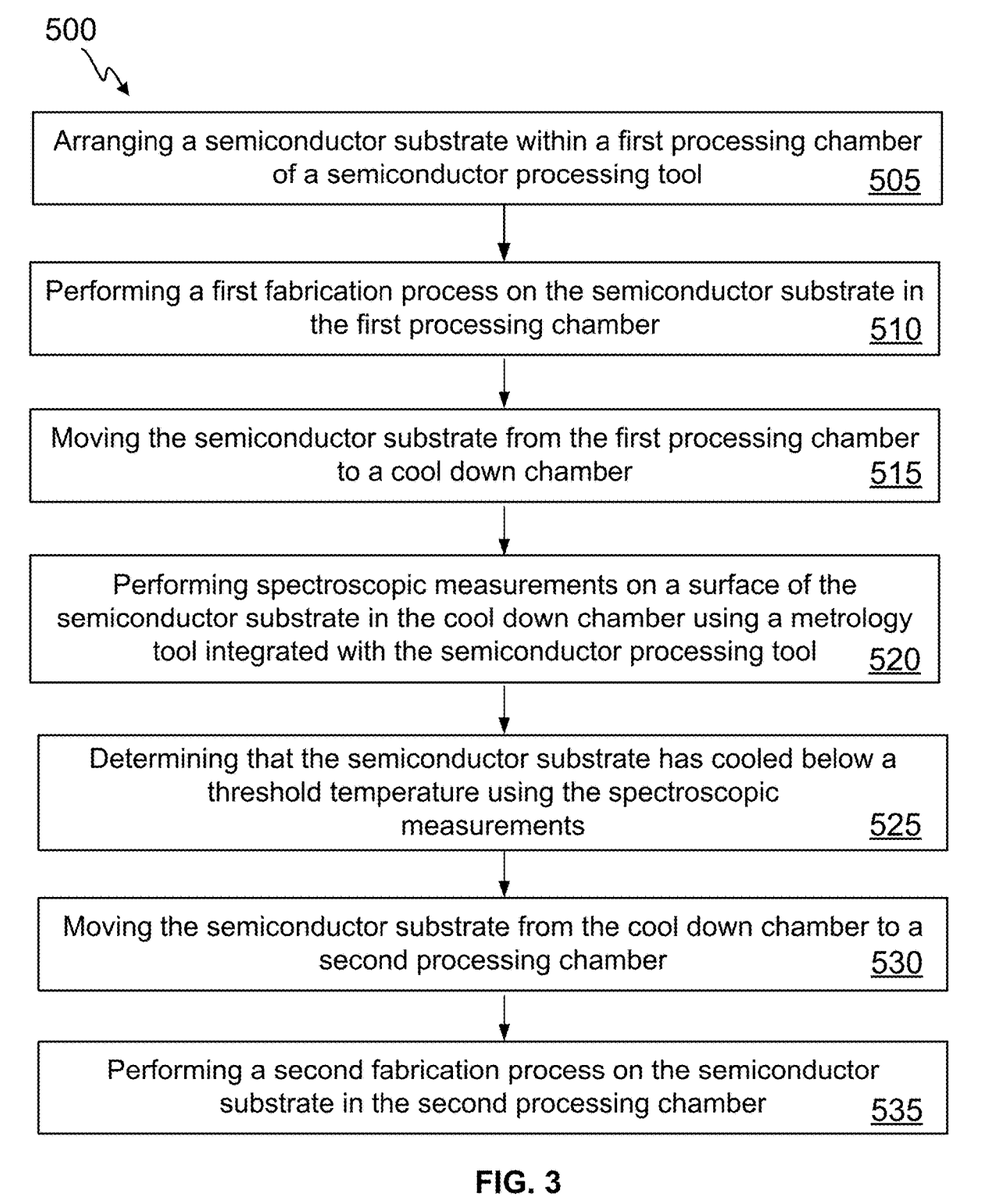
FIG. 3 is a flowchart illustrating an exemplary method for monitoring temperature of a substrate according to some of the embodiments described herein.

FIG. 3 is a flowchart illustrating an exemplary method for monitoring temperature of a substrate according to some of the embodiments described herein. The method includes arranging a semiconductor substrate within a first processing chamber of a semiconductor processing tool (505). The semiconductor processing tool may be a multi-chamber processing tool, and the semiconductor substrate may be arranged within the first processing chamber using a robot.

The method also includes performing a first fabrication process on the semiconductor substrate in the first processing chamber (510). The first fabrication process is not limited to a particular process and may include, for example, deposition, anneal, etch, or other processes.

The method also includes moving the semiconductor substrate from the first processing chamber to a cool down chamber (515). The semiconductor substrate may be moved from the first processing chamber to the cool down chamber using a robot. In some semiconductor processing tools, the cool down chamber may be a transfer chamber like transfer chambers 122, 124 illustrated in the example of FIG. 1.

The method also includes performing spectroscopic measurements on a surface of the semiconductor substrate in the cool down chamber using a metrology tool integrated with the semiconductor processing tool (520). In some embodiments, the metrology tool may be a reflectometer, and performing the spectroscopic measurements may include performing reflectance measurements on a surface of the semiconductor substrate. The reflectance measurements may be used to determine a characteristic of the semiconductor substrate (e.g., film thickness) as well as to monitor a temperature of the semiconductor substrate. In some embodiments, the reflectance measurements may be performed at multiple different areas on the surface of the semiconductor substrate simultaneously. The multiple different areas may have the same film stack and similar structural features.

In some embodiments, the method may include modeling a relationship between one or more optical constants of film stacks and temperature of the film stacks and/or modeling a relationship between the semiconductor substrate and temperature of the semiconductor substrate. The model may be obtained prior to processing the semiconductor substrate and may be obtained using known techniques. The model may be used along with the spectroscopic measurements to monitor temperature of the film stacks and/or substrate.

The method also includes determining that the semiconductor substrate has cooled to a threshold temperature or below the threshold temperature using the spectroscopic measurements (525). As explained above, the semiconductor substrate may be transferred from the cool down chamber once it has reached a threshold temperature.

In the example of FIG. 3, the method also includes moving the semiconductor substrate from the cool down chamber to a second processing chamber (530), and performing a second fabrication process on the semiconductor substrate in the second processing chamber (535). The second fabrication process may be performed at a lower temperature than the first fabrication process. In other embodiments, the method may include moving the semiconductor substrate to a load lock or unload chamber. The semiconductor substrate may be moved using a robot.

In some embodiments, all the steps listed in the exemplary method of FIG. 3 are performed under continuous vacuum.

It should be appreciated that the specific steps illustrated in FIG. 3 provide particular methods for monitoring temperature according to some embodiments. Other sequences of steps may also be performed according to alternative embodiments. For example, alternative embodiments may perform the steps outlined above in a different order. Moreover, the individual steps illustrated in FIG. 3 may include multiple sub-steps that may be performed in various sequences. Furthermore, additional steps may be added or removed depending on the particular application.

An alternative embodiment similar to the method of FIG. 3 may include performing the first fabrication process, performing the spectroscopic measurements, and determining that the semiconductor substrate has cooled below a threshold temperature all in a common processing chamber to provide in-chamber process integration. The process may also include performing the second fabrication process in the same processing chamber as the other steps. In this example, the semiconductor substrate is not moved to a cool down chamber like the example of FIG. 3, and multiple processing steps may be performed in the common processing chamber.

Figure 4:
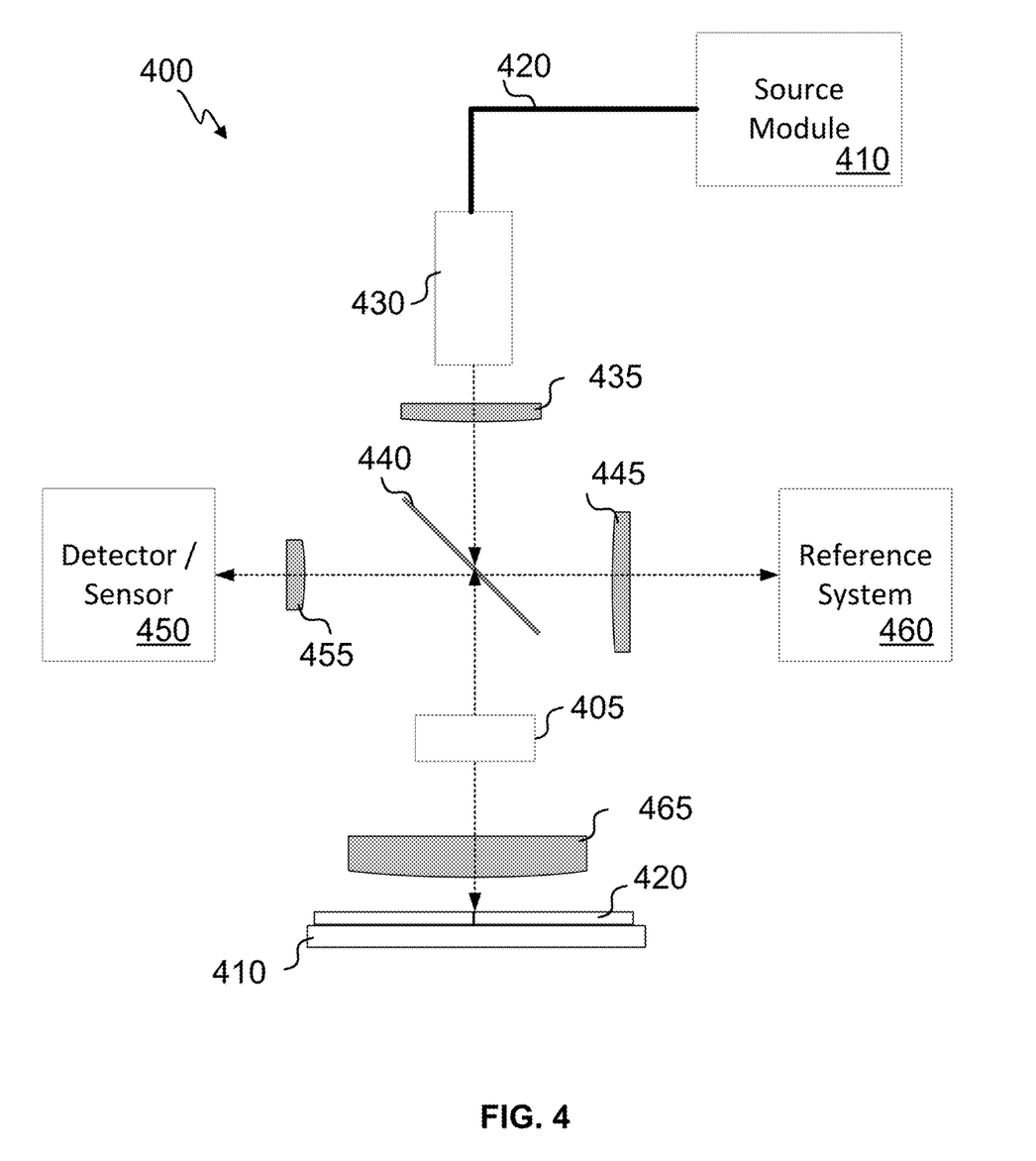
FIG. 4 is a simplified cross-sectional view of an exemplary metrology tool that may be used in accordance with some of the embodiments described herein.

FIG. 4 is a simplified cross-sectional view of an exemplary metrology tool 400 that may be used in accordance with some of the embodiments described herein. The metrology tool 400 may be used for process control and temperature monitoring. The metrology tool 400 may be integrated with a processing tool. Although a number of different kinds of metrology tools may be used to provide analysis and temperature monitoring in accordance with embodiments described herein, the metrology tool 400 in this example is reflectometer. In this exemplary reflectometer, light from a source module 410 is relayed through a light guide 420 to a homogenizer 430. The light from the homogenizer 430 is directed toward a beam splitter 440. A portion of the light is reflected by the beam splitter 440 toward a reference system 460, and a portion of the light passes through the beam splitter 440 and continues along an optical path toward a sample 420 on a support 410.

In this example, the portion of the light that passes through the beam splitter 440 passes through a polarizer 405 and lens 465 before reaching the sample 420. The lens 465 may be composed of a single lens or include a plurality of lenses. Light reflected from the sample 420 is directed through at least a portion of the lens 465 and reflected by the beam splitter 440 toward one or more detectors or sensors 450. The light reflected from the sample 420 can include the spectroscopic emissions that can be used to determine characteristics of the sample 420 (e.g., fil thickness) and can also be used for temperature monitoring.

The metrology tool 400 may include a number of other lenses (e.g., 435, 445, 455) that shape and/or direct the light along optical paths to the sample 820, to the reference system 460, and to direct the light reflected from the sample 420 to the detector 450. It should be appreciated that metrology tool in accordance with the embodiments described herein may not include all optical elements shown in FIG. 4 and/or may include other optical elements that are not included in this example. Further, the metrology tool 400 is used merely as an example and other types of metrology tools may be used with the embodiments described herein.

Figure 5:
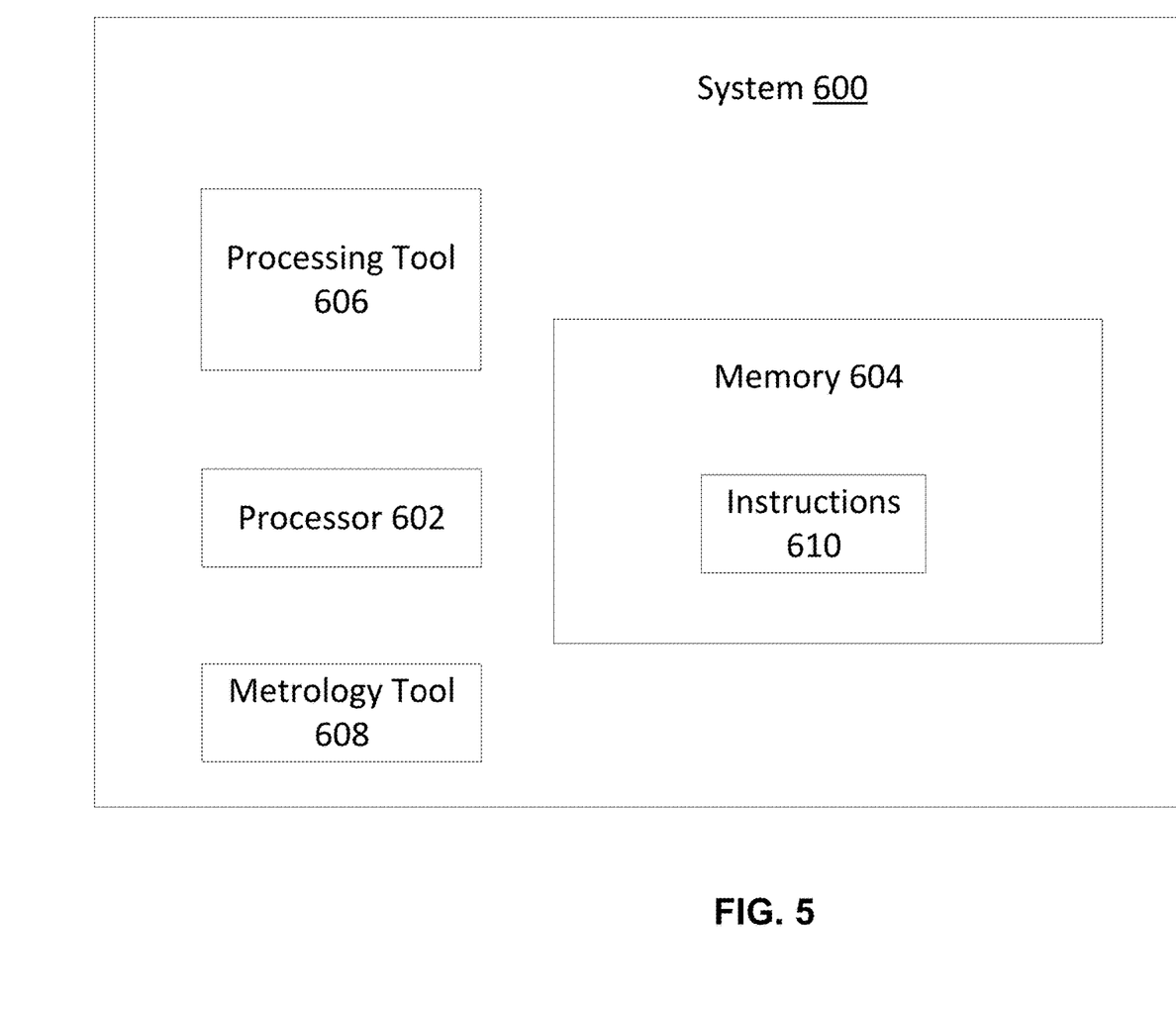
FIG. 5 is a simplified block diagram of an exemplary system for processing substrates and monitoring temperature substrates according to some of the embodiments described herein.

FIG. 5 is a simplified block diagram of an exemplary system 600 for monitoring temperature of a substrate according to some of the embodiments described herein. The system 600 includes a processing tool 606 configured to perform a process on a substrate, and a metrology tool 608 configured to perform analysis of the substrate. The other components shown in FIG. 5 include processor 602 and memory 604. These components may be integrated into a single structure such as within the single housing of the processing tool 606, the metrology tool 608, or another computing device. Alternatively, these components may be distributed between the semiconductor processing tool 606, the metrology tool 608, and/or another computing device.

The processor 602 may be communicatively coupled to the memory 604. The processor 602 can include one processor or multiple processors. Non-limiting examples of the processor 602 include a Field-Programmable Gate Array (FPGA), an application specific integrated circuit (ASIC), a microprocessor, or any combination of these. The processor 602 can execute instructions 610 stored in the memory 604 to perform operations (such as the steps illustrated in exemplary method of FIG. 3).

The memory 604 can include one memory device or multiple memory devices. The memory 604 can be volatile and/or non-volatile and may include any type of memory device that retains stored information when powered off. Non-limiting examples of the memory 604 include electrically erasable and programmable read-only memory (EEPROM), flash memory, or any other type of memory. At least some of the memory 604 can include a non-transitory computer-readable medium from which the processor 602 can read the instructions 610. The non-transitory computer-readable medium can include electronic, optical, magnetic, or other storage devices capable of providing the processor 602 with the instructions 610 or other program code. Non-limiting examples of the non-transitory computer-readable medium include magnetic disk(s), memory chip(s), RAM, an ASIC, or any other medium from which a computer processor can read instructions 610.

The memory 604 can further include data from metrology measurements and associated models. In some examples, processor 602 can use spectroscopic measurements to determine characteristics of a substrate (e.g., fil thickness) and to monitor temperature of the substrate.

In some examples, the system 600 can implement the methods described herein for effectuating some aspects of the present disclosure.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

What is claimed is:

1. A method for monitoring temperature of a semiconductor substrate during a cool down step of a multi-step fabrication process, the method comprising:
   arranging the semiconductor substrate within a first processing chamber of a semiconductor processing tool;
   performing a first fabrication process on the semiconductor substrate in the first processing chamber;
   moving the semiconductor substrate from the first processing chamber to a cool down chamber;
   performing spectroscopic measurements on a surface of the semiconductor substrate in the cool down chamber using a metrology tool integrated with the semiconductor processing tool;
   determining that the semiconductor substrate has cooled below a threshold temperature using the spectroscopic measurements;
   moving the semiconductor substrate from the cool down chamber to a second processing chamber; and
   performing a second fabrication process on the semiconductor substrate in the second processing chamber.

2. The method of claim 1, wherein all the steps are performed under continuous vacuum.

3. The method of claim 1, wherein performing the spectroscopic measurements includes obtaining reflectance measurements at multiple different areas on the surface of the semiconductor substrate simultaneously.

4. The method of claim 3, wherein the multiple different areas have a same film stack and similar surface features.

5. The method of claim 1, wherein the second fabrication process is performed at a lower temperature than the first fabrication process.

6. The method of claim 1, wherein the first fabrication process is a film deposition process or an anneal process.

7. The method of claim 1, further comprising modeling a relationship between one or more optical constants of film stacks or the semiconductor substrate and temperature of the film stacks or the semiconductor substrate.

8. A system comprising:
a semiconductor processing tool;
a metrology tool integrated with the semiconductor processing tool, wherein the metrology tool is configured to monitor temperature of a semiconductor substrate in a cool down chamber of the semiconductor processing tool by performing steps including:
performing spectroscopic measurements on a surface of the semiconductor substrate in the cool down chamber of the semiconductor processing tool, wherein the spectroscopic measurements are performed on multiple different areas on the surface of the semiconductor substrate; and
determining that the semiconductor substrate in the cool down chamber has cooled below a threshold temperature using the spectroscopic measurements.

9. The system of claim 8, wherein the semiconductor processing tool comprises one or more additional chambers configured to perform fabrication processes on the semiconductor substrate.

10. The system of claim 8, wherein the semiconductor processing tool comprises two or more additional chambers configured to perform fabrication processes on the semiconductor substrate, wherein at least one of the fabrication processes is a film deposition process.

11. The system of claim 8, wherein the processing tool is configured to maintain the cool down chamber under continuous vacuum during the spectroscopic measurements and while moving the semiconductor substrate between the cool down chamber and other chambers configured to perform fabrication processes on the semiconductor substrate.

12. A computer-readable medium storing instructions that, when executed by a computer, cause the computer to perform steps comprising:
performing spectroscopic measurements on a surface of a semiconductor substrate in a cool down chamber of a semiconductor processing tool, wherein the spectroscopic measurements are performed using a metrology tool integrated with the semiconductor processing tool; and
determining that the semiconductor substrate in the cool down chamber has cooled below a threshold temperature using the spectroscopic measurements.

13. The computer-readable medium of claim 12, wherein performing spectroscopic measurements includes obtaining reflectance measurements at multiple different areas simultaneously.

14. The computer-readable medium of claim 12, further comprising modeling a relationship between one or more optical constants of film stacks or the semiconductor substrate and temperature of the film stacks or the semiconductor substrate.

15. The computer-readable medium of claim 12, further comprising moving the semiconductor substrate to a processing chamber of the semiconductor processing tool upon determining that the semiconductor substrate has cooled below the threshold temperature.

* * * * *